(12) United States Patent
Johnson

(10) Patent No.: US 7,531,899 B2
(45) Date of Patent: May 12, 2009

(54) BALL GRID ARRAY PACKAGE

(75) Inventor: Kenneth W Johnson, Colorado Springs, CO (US)

(73) Assignee: Agilent Technologies, Inc., Santa Clara, CA (US)

( * ) Notice: Subject to any disclaimer, the term of this patent is extended or adjusted under 35 U.S.C. 154(b) by 262 days.

(21) Appl. No.: 11/405,337

(22) Filed: Apr. 17, 2006

(65) Prior Publication Data

US 2007/0263342 A1 Nov. 15, 2007

(51) Int. Cl.
*H01L 23/48* (2006.01)
*H01L 23/52* (2006.01)
*H01L 29/40* (2006.01)

(52) U.S. Cl. .................. 257/737; 257/688; 257/710; 257/738; 257/786; 438/613; 361/306.3; 361/600; 361/728

(58) Field of Classification Search ................ 257/688, 257/710, 737, 738, 786; 361/306.3, 600, 361/728; 438/613
See application file for complete search history.

(56) References Cited

U.S. PATENT DOCUMENTS

| 5,859,475 | A  | * | 1/1999 | Freyman et al. ............. 257/738 |
| 2006/0131744 | A1 | * | 6/2006 | O'Connor et al. ........... 257/737 |

FOREIGN PATENT DOCUMENTS

| CN | 1742371 | 3/2006 |
| JP | 2005-347710 | 12/2005 |

* cited by examiner

*Primary Examiner*—Zandra Smith
*Assistant Examiner*—Telly D Green
(74) *Attorney, Agent, or Firm*—June L. Bouscaren

(57) ABSTRACT

An apparatus and method includes an integrated circuit disposed in a ball grid array ("BGA") package having interconnects on at least one corner without signal assignments.

9 Claims, 4 Drawing Sheets

BALL GRID ARRAY PACKAGE

BACKGROUND

Ball grid array (herein "BGA") packages are known and commonly used in many electronic applications. During manufacture and test of printed circuit boards (herein "PCB"), failures stemming from the BGA occur. Under the prior art, identification and diagnosis of the failures requires a costly and time consuming destructive test of the PCB or a marginally reliable optical inspection test. While the failure is identified and diagnosed, more of the same product is manufactured potentially subject to the same failure pattern.

There is a need, therefore, for improved test and diagnostic tools to identify certain BGA failures.

BRIEF DESCRIPTION OF THE DRAWINGS

An understanding of the present teachings can be gained from the following detailed description, taken in conjunction with the accompanying drawings of which like reference numerals in different drawings refer to the same or similar elements.

DETAILED DESCRIPTION

In the following detailed description, for purposes of explanation and not limitation, example embodiments disclosing specific details are set forth in order to provide a thorough understanding of the present teachings. It is apparent to one having ordinary skill in the art with benefit of the present disclosure that other embodiments according to the present teachings that depart from the specific details disclosed herein remain within the scope of the appended claims. Moreover, descriptions of well-known apparatus and methods may be omitted so as to not obscure the description of the example embodiments. Such methods and apparatus are considered within the scope of the present teachings.

Figure 1:
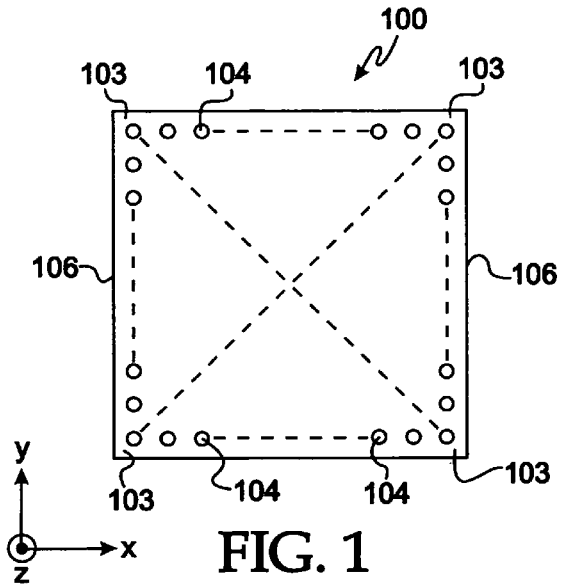
FIG. 1 is a plan view illustration of a BGA package according to the present teachings.
Figure 2:
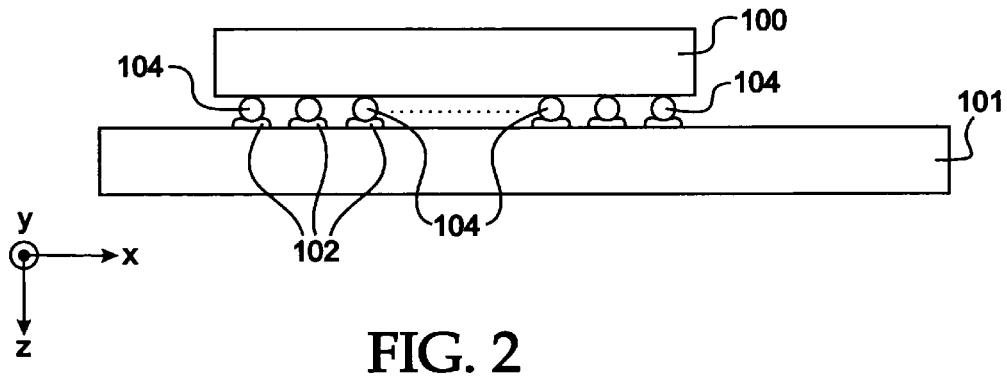
FIG. 2 is a side view illustration of a BGA package attached to a printed circuit board ("PCB") according to the present teachings.

With specific reference to FIGS. 1 and 2 of the drawings, based upon destructive tests of PCBs populated with one or more BGAs that did not pass functional test, it was determined that a common failure mode of the PCB 101 is failure of a solder joint 102 between the BGA package 100 and the PCB 101 to which the BGA package 100 is attached. Additionally, it was determined that the failures of the solder joints 102 are significantly more common with thick BGA packages than with thin BGA packages.

Upon further inspection, the identified solder joint failure mode was further characterized as occurring primarily at one or more of the four corners 103 of the BGA packages 100. The solder joint 102 between interconnects 104 of the BGA 101 and the PCB 101 provide both an electrical and mechanical connection. As one of ordinary skill in the art appreciates, the interconnects 104 of a typical BGA package 100 are small spherical electrically conductive metal. Based upon the characterization of the failure mode, it is proposed that a reason for the failure of the solder joint 102 is flexing of the PCB 101 relative to the BGA package 100 disposed on it.

Thin BGA packages are more flexible than thick BGA packages. Thin BGA packages, therefore, can flex more readily with the PCB 101 and do not place a strain on the solder joint 102. Thick BGAs are stiffer that thin BGA packages. Flexing a PCB with the thick BGA package, therefore, places a higher separation force on the connection between the BGA package 100 and the PCB 101 than similar flexing with the thin BGA package.

Figure 3:
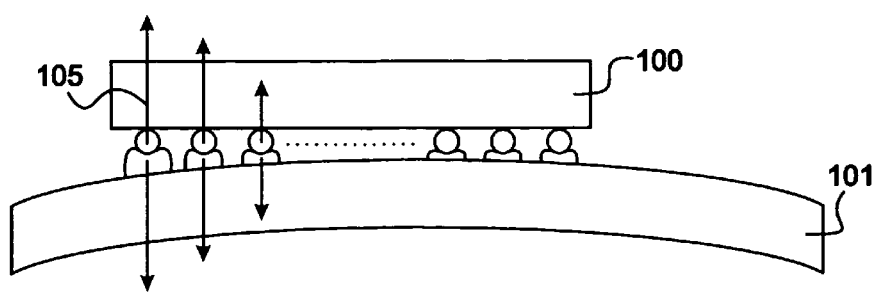
FIG. 3 is a side view illustration of the BGA package and PCB of FIG. 2 with the PCB exhibiting some amount of flex.

With specific reference to FIG. 3 of the drawings, one of ordinary skill in the art can appreciate that as the PCB 101 flexes in the z-direction relative to the BGA package 100, the relatively stiffer BGA package 100 resists the flexing. The resistance to flex generates a tensile stress 105 to the solder joint 102. The tensile stress 105 is represented as a vector in FIG. 3 of the drawings.

In most cases, the weakest attachment between the BGA package 100 and the PCB 101 is the solder joint 102. As can be appreciated by one of ordinary skill in the art, therefore, when the tensile stress 105 exceeds the strength of the solder joint 102, there is a failure of the solder joint 102. Because the solder joint 102 provides both a mechanical and electrical connection, the mechanical failure of the solder joint 102 also results in a failure of the electrical connection.

The solder joints 102 at the outer edges 106 of the BGA package 100 receive the greatest amount of tensile stress 105. The solder joints 102 closer to the center of the BGA package 100 receive relatively less tensile stress. As one of ordinary skill in the art appreciates, flexure of the PCB 101 can occur in both the x-z direction as well as the y-z direction. Flexure may be the result of physical bending of the PCB 101 or may occur as a result of different thermal expansion between the PCB 101 and the BGA package 100. If the tensile stress as a result of flexure in both directions add, the tensile stress at the corners 103 of the BGA package 100 is greatest. Accordingly, it is reasonable to expect that failures of one or more solder joints 102 as a result of the identified failure mode will occur at the corners 103 of the BGA package 100.

Empirical evidence of solder joint failures shows this to be true, which provides confidence that the identified failure mode is the cause of the failures.

When the solder joint 102 fails, the tensile stress 105 on the failed solder joint 102 goes to zero and there is no resistance to displacement between the BGA package 100 and the failed solder joint 102. As a result, the BGA package 100 is permitted to separate from the PCB 101 at the site of the failed solder joint 102. Tensile stress remains on the adjacent solder joint 102 and it also fails if the tensile stress exceeds the strength of the solder joint 102. In some cases, failure of the corner solder joint may indicate that stress was applied to the PCB and the failure absorbed enough of the stress to prevent failure of adjacent interconnects.

Solder joints 102 that fail under the failure mode identified as part of the present teachings, the failure is most likely to occur at one or more of the corners of the BGA package 100. Reasons proposed for the increased likelihood are that the solder joints 102 at the corners 103 of the BGA package 100 do not have benefit of adjacent solder joints 102 that help to distribute resistance to the tensile stress 105 applied. Therefore, the displacement of the flexure of the PCB 101, the direction of the flexure, and the stiffness of the BGA package 100 determine which corner 103 experiences one or more failed solder joints 102 and how many of the solder joints 102 actually fail.

If it is accepted that flexing forces are applied to all PCBs 101 at various stages of the manufacturing process, then failure of the solder joint 102 may be accepted as a likelihood. It is further proposed to beneficially use acceptance of this likelihood to improve a manufacturing process of a PCB 101 populated with one or more BGA packaged integrated circuits.

Figure 4:
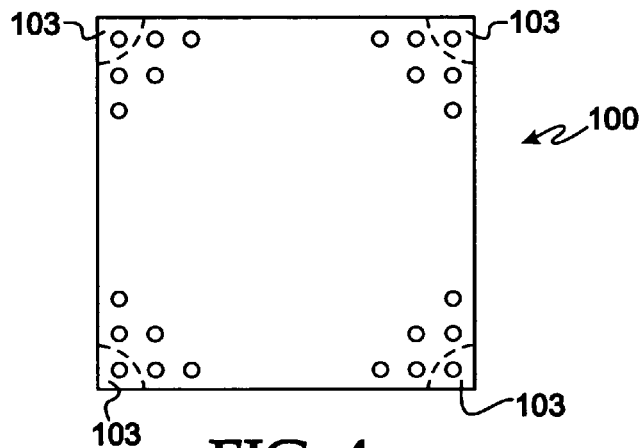
FIGS. 4 through 6 illustrate different corner definitions appropriate according to the present teachings.

Specifically, according to one embodiment of the present teachings, the BGA package 100 may be designed without signal assignments at one or more of the corners 103 of the BGA package 100. In another embodiment, each of the four corners 103 of the BGA package 100 have interconnects 104 without signal assignments. With specific reference to FIG. 4 of the drawings, each corner 103 of the BGA package 100 may be defined as the single interconnect 104 closest to the respective corners 103 of the BGA package. As one of ordinary skill in the art can appreciate, many definitions of "corner 103" are applicable to the present teachings. With specific reference to FIG. 5 of the drawings, there is shown a configuration where the term "corner 103" is defined as three interconnects total, one that delineates each extreme corner 103 of the BGA package and the two interconnects just adjacent to it along respective perpendicular sides of the package 100. With specific reference to FIG. 6 of the drawings, there is shown another embodiment where five interconnects 104 define each corner 103 of the BGA package 100. In the embodiment of FIG. 6 of the drawings, the five interconnects 104 are the extreme corner interconnect, the two adjacent to it, and the three next adjacent to the two. Many other corner definitions are will occur to one of ordinary skill in the art without departing from the intentions of the present teachings.

The interconnects 104 at the corners 103 of the BGA package 100 may be left completely unassigned thereby acting as a stress relieving and sacrificial buffer for interconnects 104 adjacent the corners 103 of the BGA package 100. This will serve to reduce the likelihood of PCB failure as it travels through the manufacturing process. If the solder joint 102 fails, the interconnects 104 at the corners 103 of the BGA package 100 provide a nondestructive test for presence of mechanical stress during the manufacturing process.

The interconnects 104 at the corners 103 of the BGA package 100 may be assigned only to power or ground or a combination of both. Because power and ground are typically redundant connections, failure of a small subset of the power and ground connections does not result in failure of the PCB 101. Therefore, the interconnects 104 at the corners of the BGA package 100 provide connections that remain valuable to the PCB 101 in the event of no failure of the solder joint 102 but are still dispensable in the event that a failure does occur.

In some cases, it may be possible to repair the identified failed solder joints 102 by reflowing the solder to reconnect the interconnects to the PCB 101. Beneficially, therefore, identification of the failure mode and isolation of the location of the failure can prevent loss of one or more fully manufactured by repairing a PCB 101 that might have otherwise been scrapped.

Figure 7:
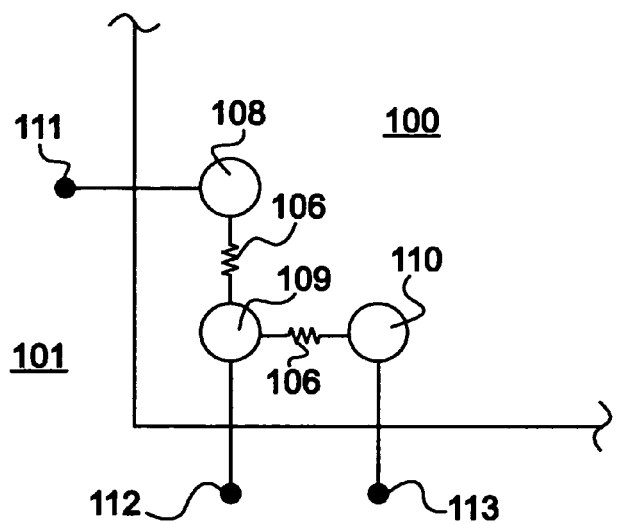
FIGS. 7 and 8 illustrate embodiments of corner series circuits for purposes of solder joint failure testability.

In another embodiment and with specific reference to FIG. 7 of the drawings, the interconnects 104 at the corners 103 of the BGA package 100 may be interconnected in a series circuit. Beneficially, the series circuit provides visibility into whether one or more solder joints 102 failed for each BGA package 100 that populates the PCB 101.

Figure 5:
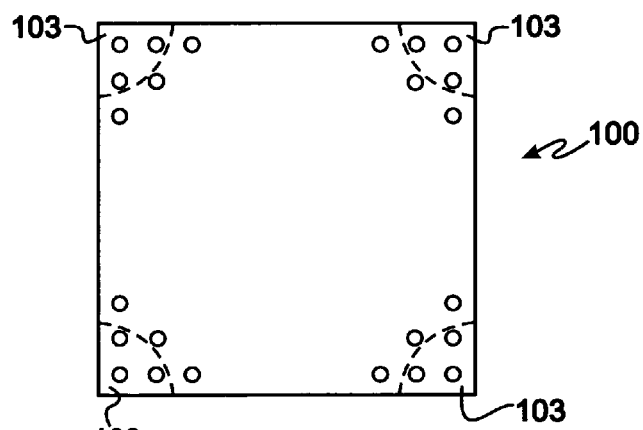
Figure 6:
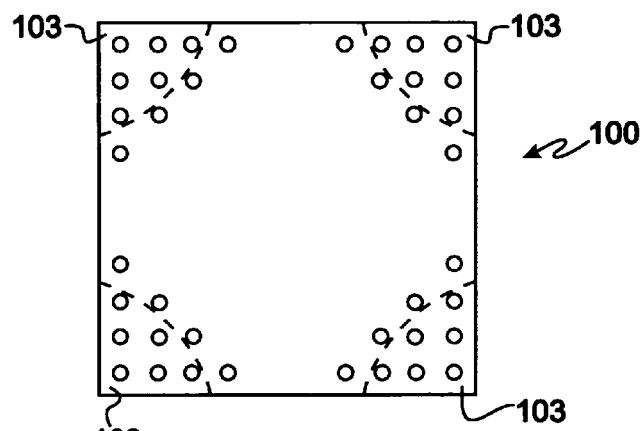

For purposes of illustration, FIG. 7 shows a single corner 103 of the BGA package 100 as defined in the embodiment of FIG. 5 of the drawings. It is apparent, however, that the present teachings may be applied to any of the other illustrated embodiments, or embodiments not shown, but within the scope of the present teachings. The series circuit shown in FIG. 7 of the drawings, places package continuity traces 106 between first 108, second 109 and third 110 interconnects 104 at the corner 103 of the BGA package 100. The package continuity traces 106 are disposed on the BGA package 100 and may be generated as part of the overall BGA package design for purposes of testability. The package continuity traces 106 may include small resistors or may be short circuits comprising printed traces. As part of this testability in the embodiment of FIG. 7, therefore, first, second, and third visibility ports 111, 112, 113 are supplied on the PCB 101 connected to the solder joints 102 of the interconnects 108, 109, 110 respectively. A continuity test or resistance measurement is made between the visibility ports 111, 112, 113 for purposes of PCB testing. For purposes of this discussion, continuity and measurement of a resistance below a certain threshold is used synonymously. For example, in FIG. 7, a detected discontinuity or high impedance between the first and second visibility ports 111, 112 indicates that one or both of the solder joints to the first and second interconnects 108, 109 failed. A detected discontinuity between the second and third visibility ports 112, 113 indicates that one or both of the solder joints 102 to the second and third interconnects 109, 110 failed. If continuity is found between the first and second visibility ports 111, 112 and between the second and third visibility ports 112, 113, it may be inferred that all three of the solder joints 102 for the interconnects 108, 109, 110 are in tact. If a discontinuity is found, it may be inferred that one or more of the solder joints 102 at the corner 103 of the BGA package 100 has failed. If it is desirable to identify which solder joint failed, a third continuity test may be made. For example, if continuity is found between ports 111 and 112 and a discontinuity is found between ports 112 and 113, it may be inferred that the solder joint 102 to interconnect 110 failed and the other two are in tact. It is typically most convenient that the visibility ports 111, 112, 113 be disposed on the PCB 101. In another embodiment, in order to distinguish with the continuity check whether two of the three solder joints failed or all three solder joints failed, a visibility port is also disposed on the BGA package 101.

There may be one discrete series circuit for each corner 103 or two or more of the corners 103 may be interconnected into a larger series circuit. Discrete circuits at each corner 103 of the BGA package provide visibility into a corner location of the detected failure and takes additional time to make the measurement to isolate the location of the failure. A single interconnected circuit that tests all corners 103 at the same time takes less test time to identify a failure and provides only BGA package level visibility into the location of the failure. Depending upon how repair is performed or if repair is attempted, the unique advantages of each method will make one method more appropriate than another in different applications.

Figure 8:
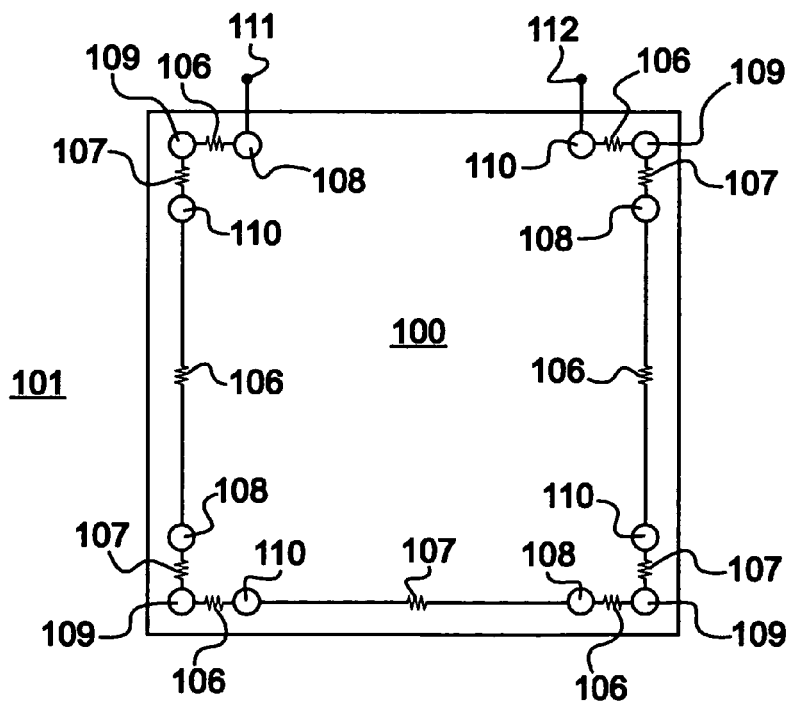

With specific reference to FIG. 8 of the drawings, there is shown another embodiment of a series circuit suitable for testing solder joint failure at corners 103 of the BGA package 100. As one of ordinary skill in the art appreciates, FIG. 8 illustrates an embodiment where the corners 103 are defined as the three interconnects 104 that are closest to each of the respective four corners of the BGA package 100. In the embodiment illustrated in FIG. 8, each corner 103 is interconnected into a series circuit and the series circuits of all four corners 103 are also interconnected. In the embodiment of FIG. 8, the continuity traces between the interconnects 108, 109, 110 alternate between disposition on the BGA package 100 and disposition on the PCB 101. Specifically, the series circuit for continuity testing comprises alternating package continuity traces 106 and PCB continuity traces 107. The visibility ports 111, 112 are disposed on opposite ends of the larger series circuit and on the PCB 101 in this embodiment. A continuity test or resistance measurement, therefore, indicates whether one or more solder joints 102 at any of the interconnects failed, but does not indicate which one or more of the interconnects has a failed solder joint. In an alternate embodiment, additional visibility ports 111, 112 may be disposed along the series circuit for purposes of improved isolation of an identified discontinuity.

After the continuity test for the corner solder joints 102 or after repair is attempted, a test may be made of the PCB 101 to determine if functions of the PCB work as expected. If the PCB 101 passes the functional test even when it is known that the solder joints 102 at the corner 103 failed, it is further known that failure was limited to one or more of the corner interconnects 108, 109, 110 or that repair was successful if it were attempted. If the PCB 101 does not pass the functional test, there is the possibility that solder joints 102 to interconnects 104 that are adjacent to the corner 103 may also have failed and were not repaired or repair was not attempted. For purposes of reliability, therefore, a PCB designer may choose to improve the manufacturing process by defining a larger BGA package corner 103 or may make adjustments to the PCB manufacturing process to reduce flexure of the PCB 101 or both.

Figure 9:
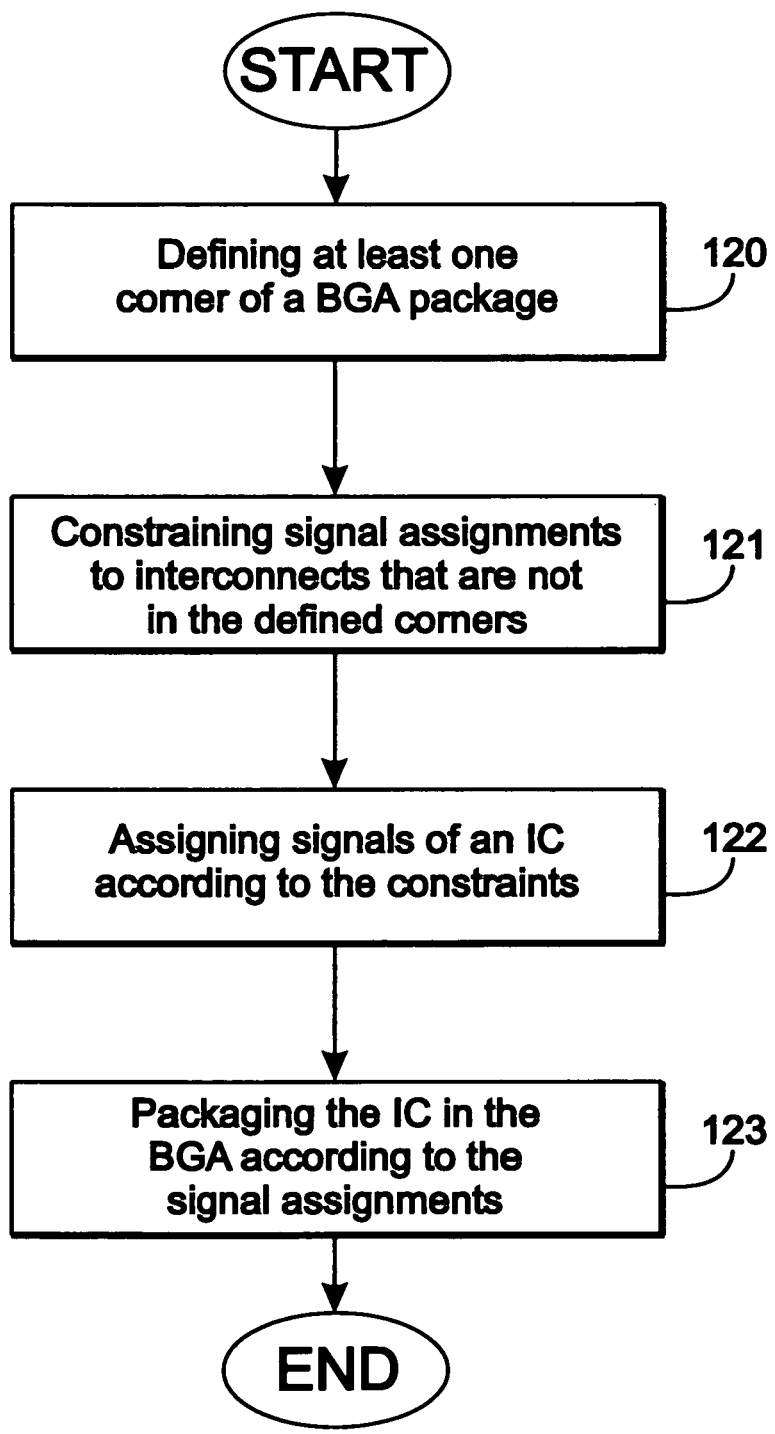
FIG. 9 is a flow chart of a process according to the present teachings.

With specific reference to FIG. 9 of the drawings, there is shown a flow chart of an embodiment of a method according to the present teachings in which at least one corner of a BGA package 100 is defined 120. A BGA designer constrains 121 signal assignments of an IC that is to be packaged into the BGA to those interconnects 104 that do not populated the defined corners 103. Signals of the IC are assigned 122 according to the constraints and the IC is packaged 123 according to the constrained signal assignments. Optionally, and not shown in the flow chart of FIG. 9, a continuity test or resistance measurement may be made after a PCB 101 is manufactured to identify and isolate failures of solder joints 102 of the BGA package 100.

Embodiments of the teachings are described herein by way of example with reference to the accompanying drawings describing various embodiments of an apparatus and method to improve visibility into PCB manufacturing failures. Other variations, adaptations, and embodiments of the present teachings not specifically disclosed will occur to those of ordinary skill in the art given benefit of the present teachings. For example, other embodiments with variants and combinations of alternating package and PCB continuity traces not specifically disclosed are also contemplated. A single corners defined by 4 or more interconnects may comprise a series circuit with alternating package and PCB continuity traces. Two or more corners may be interconnected in a series circuit with BGA continuity traces and any number of visibility ports disposed on the PCB. Visibility ports may also be disposed on the BGA package and a combination of both the BGA package and the PCB.

The invention claimed is:

1. A method comprising:
   defining at least one corner of a ball grid array ("BGA") package the corner having at least one interconnect,
   constraining signal assignments for the BGA package to interconnects that are outside of the at least one corner of the BGA package,
   assigning signals of an integrated circuit ("IC") to interconnects of the BGA package according to the constraint,
   creating a series circuit comprising continuity traces between the interconnects in one corner of the BGA package,
   packaging the IC in the BGA package,
   electrically connecting the packaged BGA to a printed circuit board (PCB), the PCB having visibility ports connected to electrical ends of the series circuit, and
   measuring continuity of the series circuit via the visibility ports to identify an open circuit between at least one of the interconnects in the series circuit and the PCB.

2. A method as recited in claim 1 and further comprising assigning interconnects in the corner of the BGA package only to assignments selected from the group consisting of power and ground.

3. A method as recited in claim 1 wherein the series circuit comprises continuity traces alternatingly disposed on the BGA package and the PCB electrically connecting the interconnects.

4. A method as recited in claim 1 and further comprising identifying a location of at least one solder joint failure based upon results of the measuring step.

5. A method as recited in claim 4 and further comprising repairing the identified failure.

6. A method comprising
   defining at least two corners of a ball grid array ("BGA") package, each corner having at least one interconnect,
   constraining signal assignments for the BGA package to interconnects that are outside of the defined corners of the BGA package,
   assigning signals of an integrated circuit ("IC") to interconnects of the BGA package according to the constraint, and
   creating a single series circuit between at least two of the corners.

7. A method as recited in claim 6 and further comprising electrically connecting the BGA package to a PCB and measuring continuity in the series circuit and identifying at least one solder joint failure.

8. A method as recited in claim 7 and further comprising isolating a location of the identified solder joint failures.

9. A method as recited in claim 8 and further comprising repairing the identified failures.

* * * * *